US007236424B2

(12) United States Patent
Tokiwa

(10) Patent No.: US 7,236,424 B2
(45) Date of Patent: Jun. 26, 2007

(54) SEMICONDUCTOR MEMORY DEVICE

(75) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 303 days.

(21) Appl. No.: 11/086,444

(22) Filed: Mar. 23, 2005

(65) Prior Publication Data

US 2006/0044874 A1     Mar. 2, 2006

(30) Foreign Application Priority Data

Aug. 25, 2004   (JP)   ............................. 2004-244936

(51) Int. Cl.
*G11C 8/00* (2006.01)
*G11C 8/18* (2006.01)
(52) U.S. Cl. ..................... 365/233; 365/233.5; 327/172
(58) Field of Classification Search ................. 365/233
See application file for complete search history.

(56) References Cited

U.S. PATENT DOCUMENTS

| | | | | |
|---|---|---|---|---|
| 6,215,726 | B1 * | 4/2001 | Kubo ......................... | 365/233 |
| 6,477,107 | B1 * | 11/2002 | Lee ............................ | 365/233 |
| 6,728,162 | B2 * | 4/2004 | Lee et al. .................... | 365/233 |
| 6,798,697 | B2 | 9/2004 | Hosono et al. | |
| 6,813,696 | B2 * | 11/2004 | Kanda et al. ............... | 711/167 |
| 7,023,254 | B2 * | 4/2006 | Choi et al. ................... | 327/175 |
| 7,038,971 | B2 * | 5/2006 | Chung ........................ | 365/233 |
| 2002/0008558 | A1 * | 1/2002 | Okuda et al. ............... | 327/175 |
| 2005/0141334 | A1 * | 6/2005 | Jeong ......................... | 365/233 |

FOREIGN PATENT DOCUMENTS

JP          2003-233992         8/2003

* cited by examiner

*Primary Examiner*—Son L. Mai
(74) *Attorney, Agent, or Firm*—Oblon, Spivak, McClelland, Maier & Neustadt, P.C.

(57) ABSTRACT

A semiconductor memory device includes: a memory cell array, in which electrically rewritable and non-volatile memory cells are arranged; a sense amplifier circuit configured to be coupled to the memory cell array; a data transfer circuit disposed between the sense amplifier circuit and data input/output ports; a control signal generation circuit configured to generate a plurality of control signals based on a reference clock signal externally supplied, the control signals serving for controlling data input and output of the sense amplifier circuit and data transferring timing in the data transfer circuit; and an internal clock signal generation circuit configured to generate an internal clock signal based on the reference clock signal for serving as the basis of the control signals, the internal clock signal having the same clock cycle as the reference clock signal and a constant duty ratio without regard to the duty ratio of the reference clock signal.

18 Claims, 17 Drawing Sheets

SEMICONDUCTOR MEMORY DEVICE

CROSS-REFERENCE TO RELATED APPLICATION

This application is based on and claims the benefit of priority from the prior Japanese Patent Application No. 2004-244936, filed on Aug. 25, 2004, the entire contents of which are incorporated herein by reference.

BACKGROUND OF THE INVENTION

1. Field of the Invention

This invention relates to a semiconductor memory device having electrically rewritable and non-volatile memory cells.

2. Description of the Related Art

A NAND-type flash memory is known as one of electrically rewritable and non-volatile semiconductor memories (EEPROMs). Since this flash memory is formed of NAND cell units, each of which has plural memory cells connected in series in such a manner that adjacent two memory cells share a source/drain diffusion layer, it is possible to lessen a unit cell area of a memory cell array, thereby providing a memory with a large capacitance.

On the other hand, a NAND-type flash memory has a sense amplifier circuit (i.e., page buffer) with sense amplifiers for one page data, and data read and write are performed by a page of the memory cell array. One page data are serially transferred, for example, two-byte by two-byte (or byte by byte), between the sense amplifier circuit and external input/output terminals. With such the scheme, the NAND-type flash memory may be formed to have a substantially high rate read/write performance in spite of large capacitance thereof.

Further, the data output operation for one page read data in the sense amplifier circuit is done as a serial data transferring operation as synchronous with a read enable signal, which is a read-use reference clock externally supplied (refer to, for example, Unexamined Japanese Patent Application Publication No. 2003-233992).

However, in such a scheme that read data output operation is directly controlled by the read enable signal supplied from the external, it becomes difficult to provide a flash memory with a high-speed data read performance under the condition of a more lowered voltage. The reason is as follows. In case the read enable signal supplied to the flash memory is declined in change rate, and duty ratio thereof is changed due to noises on the external bus line, load variations of the bus line, impedance mismatching between the driver of an external controller and load thereof including the bus line, and the like, it becomes difficult to do timing control of the read data output operation. In detail, it may become impossible to secure a time period necessary for setting up data on the data output path disposed between the sense amplifier circuit and the input/output ports. This causes the flash memory to read erroneous data and/or data with erroneous addresses.

SUMMARY OF THE INVENTION

According to an aspect of the present invention, there is provided a semiconductor device including:

a memory cell array, in which electrically rewritable and non-volatile memory cells are arranged;

a sense amplifier circuit configured to be coupled to the memory cell array;

a data transfer circuit disposed between the sense amplifier circuit and data input/output ports;

a control signal generation circuit configured to generate a plurality of control signals based on a reference clock signal externally supplied, the control signals serving for controlling data input and output of the sense amplifier circuit and data transferring timing in the data transfer circuit; and an internal clock signal generation circuit configured to generate an internal clock signal based on the reference clock signal for serving as the basis of the control signals, the internal clock signal having the same clock cycle as the reference clock signal and a constant duty ratio without regard to the duty ratio of the reference clock signal.

DETAILED DESCRIPTION OF THE EMBODIMENTS

Illustrative embodiments of this invention will be explained with reference to the accompanying drawings below.

EMBODIMENT 1

Figure 1:
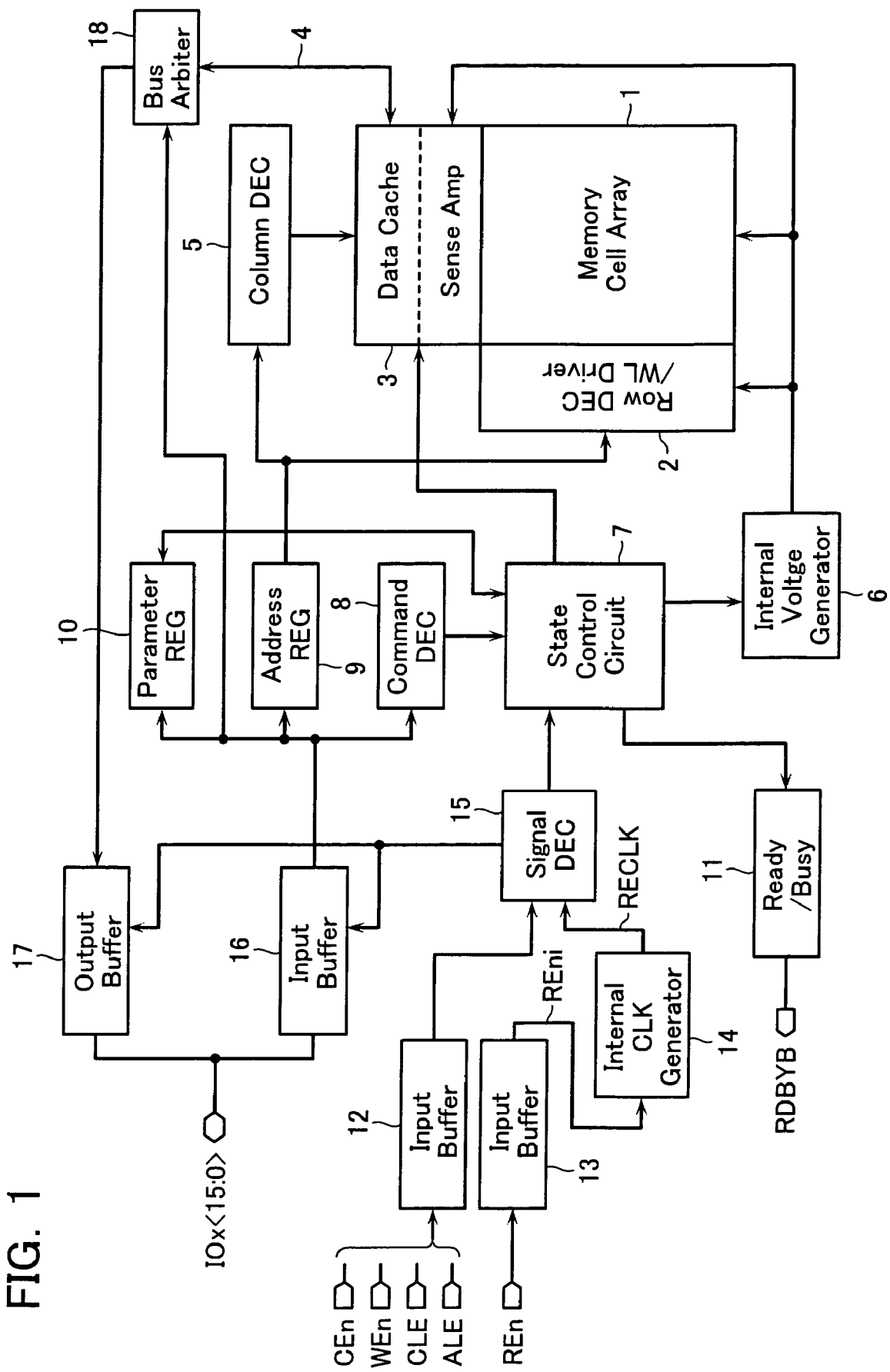
FIG. 1 shows a functional block configuration of a flash memory in accordance with an embodiment of the present invention.
Figure 2:
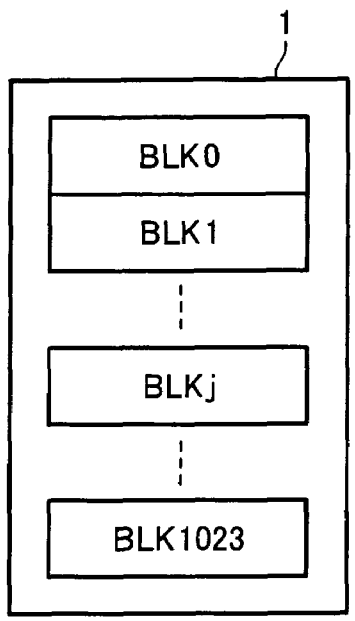
FIG. 2 shows a block arrangement of a memory cell array of the flash memory.
Figure 3:
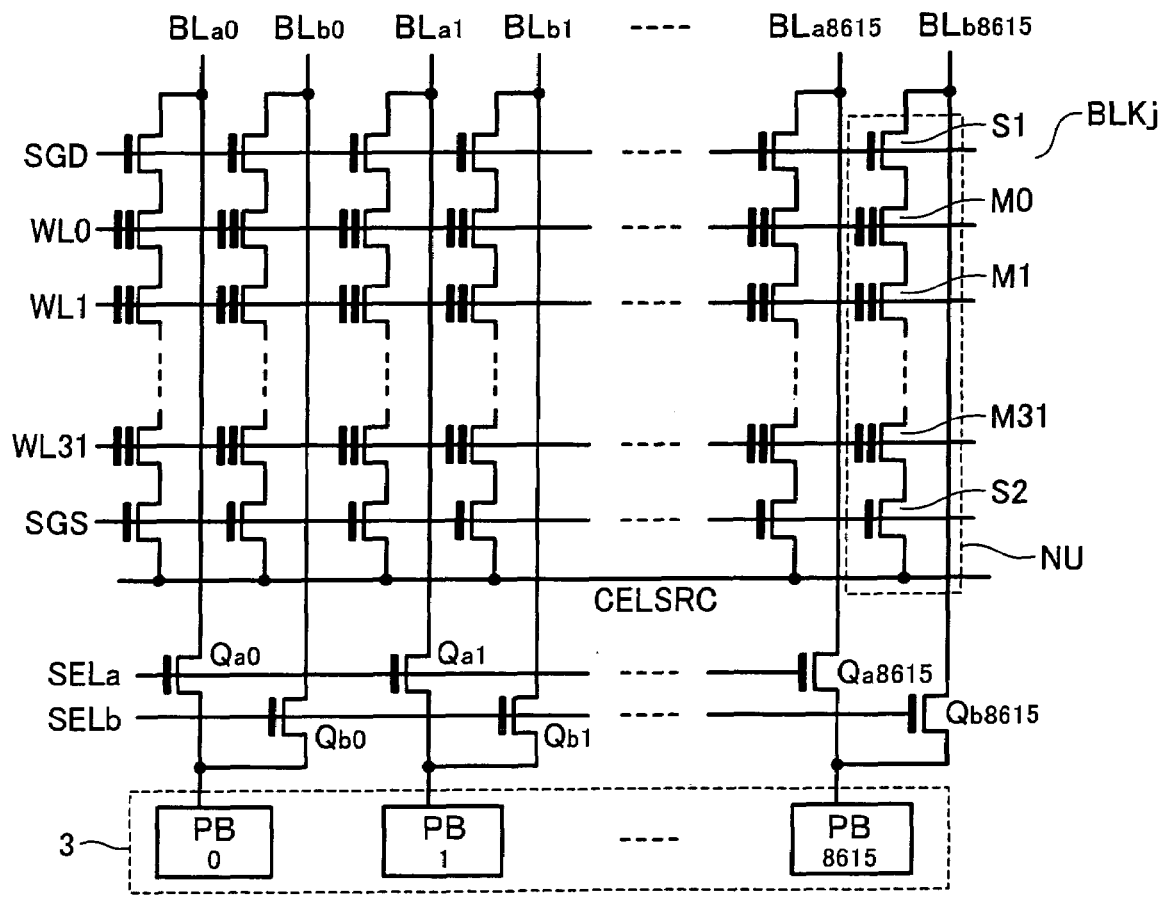
FIG. 3 shows an arrangement of the memory cell array.

FIG. 1 shows a functional block diagram of a NAND-type flash memory in accordance with an embodiment. The memory cell array 1 is, as shown in FIGS. 2 and 3, formed of NAND cell units NU arranged in a matrix manner. Each NAND cell unit NU has a plurality of electrically rewritable and non-volatile memory cells (i.e., thirty two cells in the example shown in FIG. 3) M0–M31 connected in series and select gate transistors S1 and S2, which serve for coupling the both ends of the serially connected memory cells to a bit line BL and a common source line CELSRC, respectively.

A set of NAND cell units sharing a word line constitutes a block, which serves as a unit of data erase. As shown in FIG. 2, plural blocks (BLK0, BLK1, . . . ) are arranged in the direction of the bit line.

As shown in FIG. 3, each two bit lines BLa and BLb share a sense amplifier PB. The bit lines BLa and BLb are selectively coupled to the sense amplifier PB via bit line select transistors Qa and Qb, respectively.

Memory cells disposed at crossings between a word line and even numbered bit lines constitutes one page; and memory cells disposed at crossings between the word line and odd numbered bit lines constitute the other page.

A row decoder 2, which include word line drivers and select gate line drivers, is to selectively drive word lines and select gate lines in accordance with a row address. The sense amplifier circuit 3 is coupled to bit lines for perform data read of a page and serves as a data latch for holding one page write data. That is, data read and write are performed by a page.

Attached to the sense amplifier circuit 3 are, as described later, a data cache for temporarily holding input/output data and a column gate circuit for selecting a column. Column decoder 5 is prepared to control the column select gate circuit.

The row decoder 2, column decoder 5 and sense amplifier circuit 3 constitute a read/write circuit for reading data of and writing data in the memory cell array 1 (and for verify-reading data after having written).

Data transfer between the sense amplifier circuit 3 and external input/output ports is performed serially two-byte by two-byte (or byte by byte). That is, one page read data in the sense amplifier circuit 3 are output to a data bus 4 by two bytes, and then output to the external input/output ports IOx via a bus arbiter 18 and an output buffer 17. Write data are supplied from the input/output ports IOx by two bytes and loaded in the sense via an input buffer 16 and the bus arbiter 18.

Address and command data supplied from the input/output ports IOx are distinguished from write data in a state control circuit 7, and the former is transferred to the row decoder 2 and column decoder 5 via an address register 9; and the latter is decoded in a command decoder 8 to be set in the state control circuit 7.

The state control circuit 7 controls the entire memory operations, and further controls the internal voltage generating circuit 6 to generate various internal voltages necessary for data read, write and erase based on the command and external control signals.

The external control signals, such as chip enable signal CEn, write enable signal WEn, command latch enable signal CLE, address latch enable signal ALE, read enable signal REn, are supplied to the state control circuit 7 via a signal decode circuit 15 and supplied to the input buffer 16 and output buffer 17 for controlling data input/output and address and command input.

The read enable signal REn is a reference clock signal used for reading data. In an ordinary NAND-type flash memory, column select in the sense amplifier circuit 3 and timing control of the output data transfer circuit are performed based on the logic level change of the read enable signal REn. That is, as synchronous with the read enable signal REn, column address is incremented (i.e., address counter is counted up), and output data transfer and data output allowance are controlled in a read data output mode. In contrast to this, there is provided in this embodiment an internal clock signal generation circuit 14 for generating internal control signals with the same clock cycle as the read enable signal REn and a constant duty ratio based on the read enable signal REn. The detailed configuration will be explained later.

A parameter register 10 is prepared to store test-use parameters (for example, expected output value data, write voltage value data and the like), which are externally input and used in various tests before product shipment. The parameter register 10 is usually set in an output-disabled state because the data held therein are not used after shipment.

A status register 11 is prepared for outputting a status signal, i.e., ready/busy signal RDBYB, which designates whether the chip is in a ready state or a busy state. The ready/busy signal RDBYB is set in the status register by the state control circuit 7.

Figure 4:
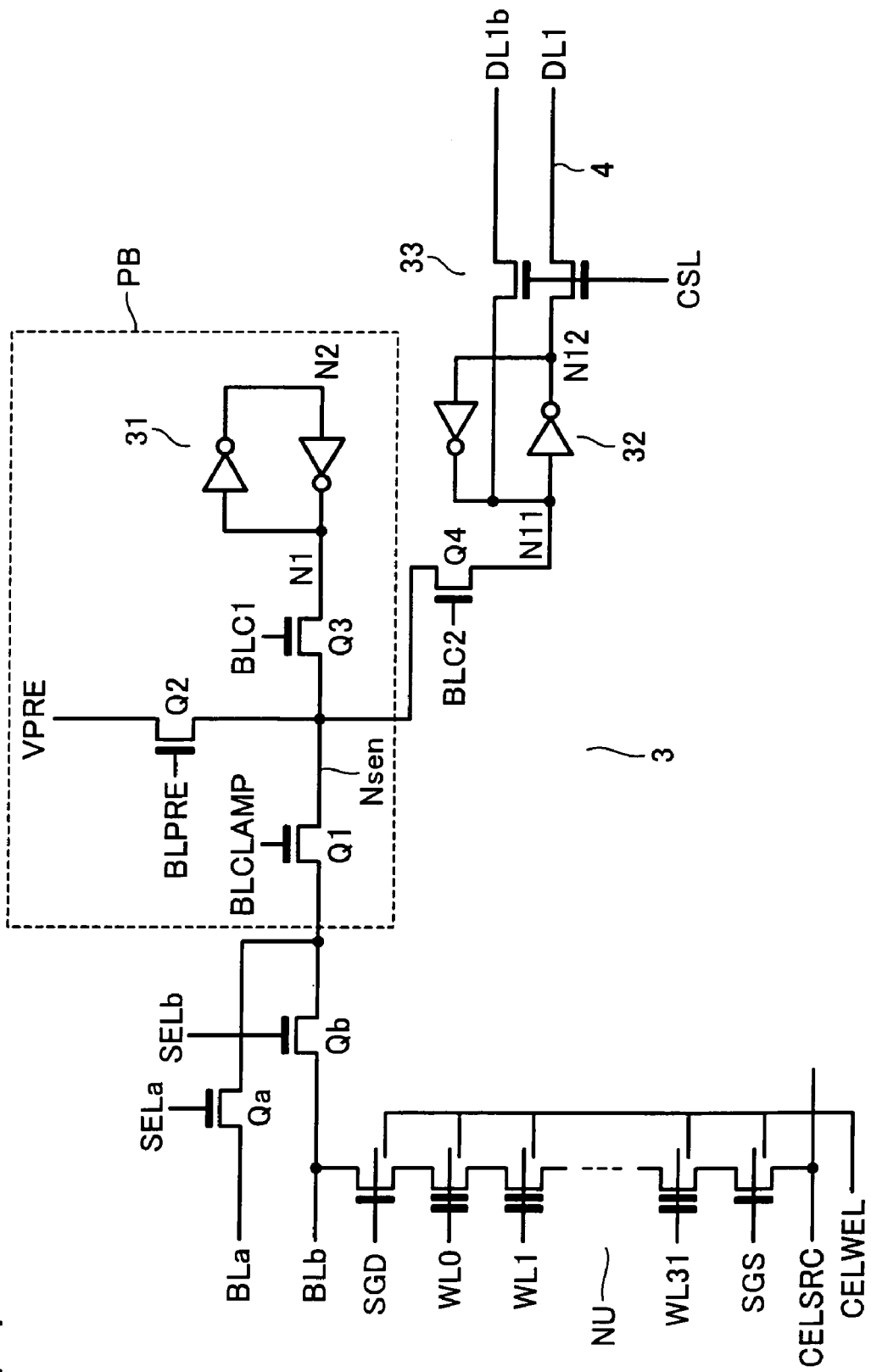
FIG. 4 shows a sense amplifier circuit of the flash memory.

FIG. 4 shows a detailed configuration of a sense amplifier PB and a data cache (data latch) 32 coupled to it in the sense amplifier circuit 3. A sense node Nsen of the sense amplifier PB is coupled to either one of the bit lines BLa and BLb via a clamping NMOS transistor Q1 and via the bit line select transistor Qa or Qb. The clamping transistor Q1 serves for clamping the bit line voltage and amplifying the bit line voltage. Connected to the sense node Nsen is a precharging NMOS transistor Q2 for precharging the bit line. The sense node Nsen is coupled to a data latch 31 via a transferring NMOS transistor Q3.

The sense node Nsen is further coupled to a data node N11 of another data latch 32, which constitutes a data cache, via a transferring NMOS transistor Q4. The data nodes N11 and N12 are coupled to complementary data lines DL1b and DL1, respectively, in the data bus 4 via column select gate 33.

Figure 5:
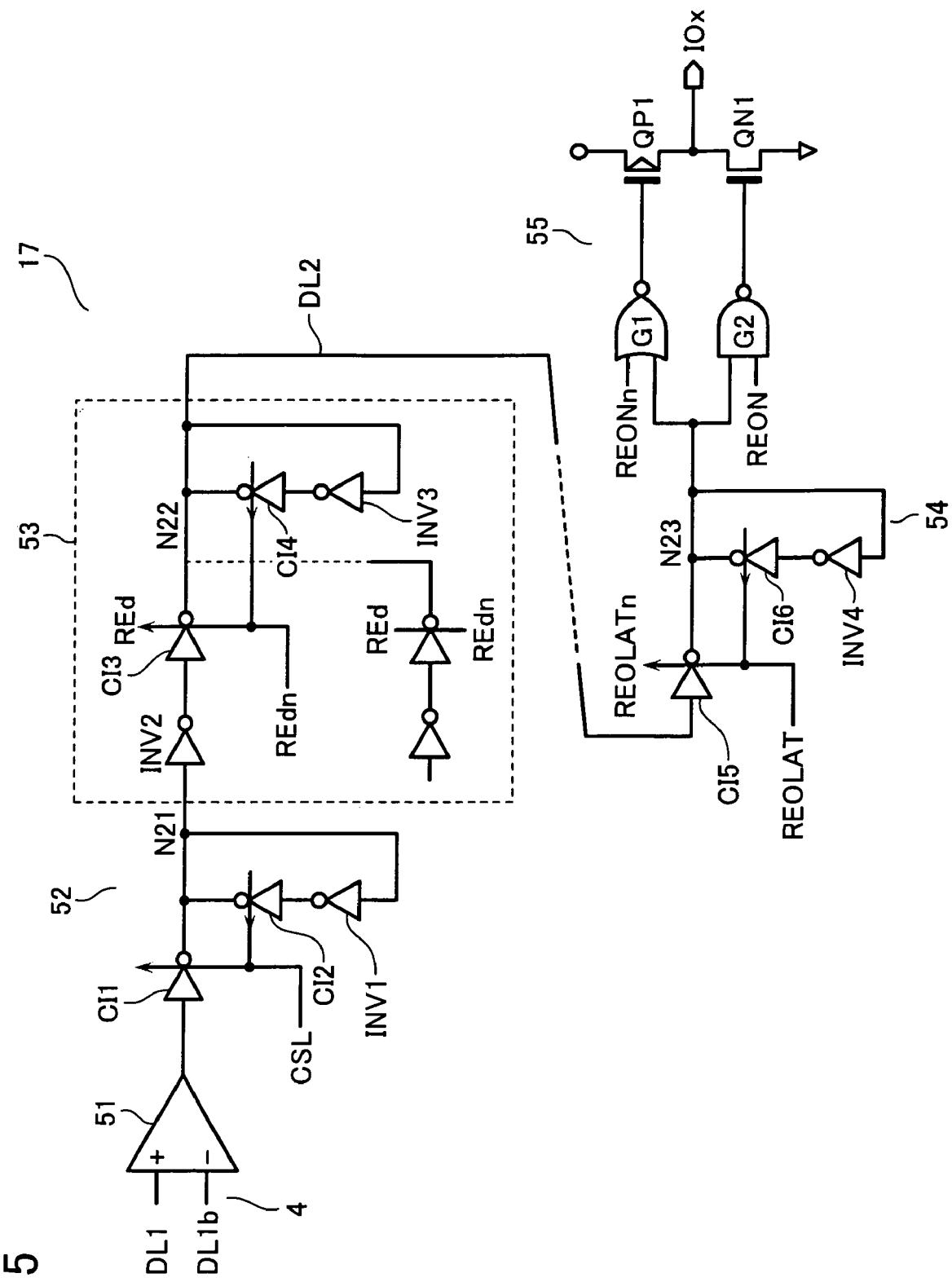
FIG. 5 shows a data output buffer of the flash memory.

FIG. 5 shows a configuration of an output data transfer circuit within the input/output data transfer circuit. In FIG. 1, the output buffer 17 is shown as one functional block. However, the output data transfer circuit constituting the output buffer 17 is in practice divided into plural circuit elements, that is, differential amplifier 51, data latch 52 and data output bus switch 53, which are disposed relatively near to the sense amplifier circuit 3; data output circuit 55 and output stage data latch 54 disposed just before it, which are disposed relatively near to the input/output ports IOx; and a data line, DL2, disposed therebetween as being relatively elongated.

The differential amplifier 51 is prepared to amplify a differential signal between the complementary data lines DL1 and DL1b in the data bus 4. The output of the differential amplifier 51 is transferred to a node N21 via a clocked CMOS inverter switch CI1, which is controlled by a column select signal CSL. Connected to the node N21 is a data latch 52, which is constituted by a clocked CMOS inverter CI2 and a CMOS inverter INV1. The clocked CMOS inverter CI2 is driven by the column select signal CSL to be activated as complementary to the clocked CMOS inverter switch CI1.

Node N21 is connected to data line DL2 via the data output bus switch 53. That is, the node N21 is connected to node N22 via inverter INV2 and clocked CMOS inverter CI3 driven by a control signal REdn, which is a delayed one of the read enable signal REn. This output bus switch 53 constitutes a plane select circuit, which selects one of plural cell array planes. Connected to the node N22 is a data latch with a clocked CMOS switch CI4, which is activated as complementary to the switch CI3, and a CMOS inverter INV3.

Node N22 is connected to node N23 via the data line DL2 and a clocked CMOS switch CI5, which is driven by an output data latch control signal REOLAT generated based on the read enable signal REn. Connected to the node N23 is a data latch with a clocked CMOS switch CI6, which is activated as complementary to the switch CI5, and a CMOS inverter INV4.

The output circuit 55 disposed at the node N23 has NOR gate G1, NAND gate G2, outputting PMOS transistor QP1 and NMOS transistor QN1, gates of which are driven by the NOR gate G1 and NAND gate G2, respectively. The NOR gate G1 and NAND gate G2 are driven by output control signals REONn and REON to be activated or inactivated, respectively. The signals REONn and REON are generated based on the read enable signal REn.

Figure 6:
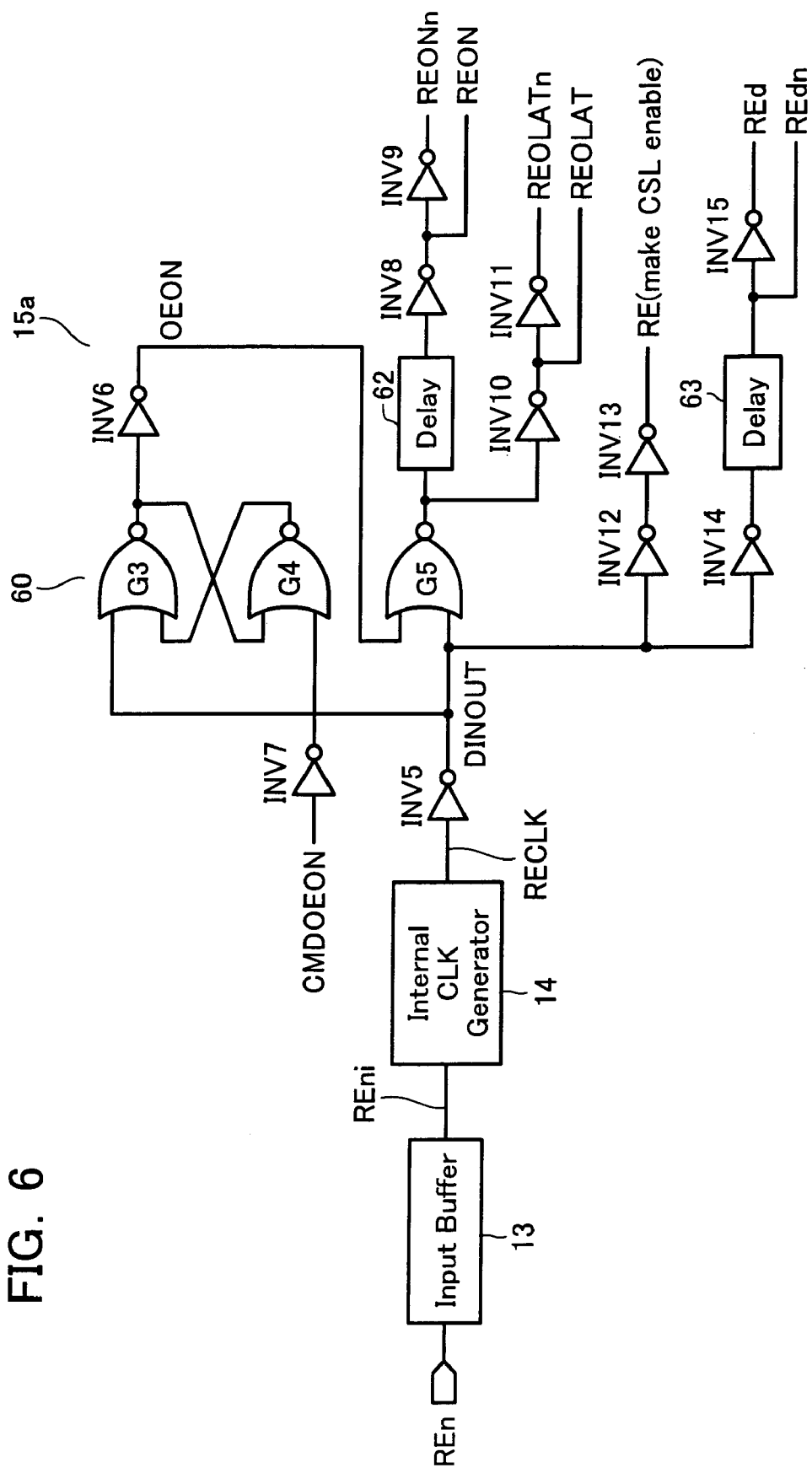
FIG. 6 shows a read control signal system of the flash memory.

FIG. 6 shows a control signal generation circuit (i.e., read enable network circuit) 15a for generating control signals for controlling the output buffer 17 such as REd, REOLAT and REON, and inverted signals REdn, REOLATn and REONn thereof. This control signal generation circuit 15a is a part of the signal decode circuit 15 shown in FIG. 1, and serves for generating the above-described control signals REd, REOLAT, REON and so on based on the read enable signal REn externally supplied.

The input buffer 13, to which the read enable signal REn is input, usually includes a filter (i.e., notch filter) for eliminating noises with narrow pulse widths. Output signal REni of the input buffer 13 is input to the internal clock generation circuit 14 so as to generate an internal clock signal RECLK with the same clock cycle as the read enable signal REn and a constant duty ratio, and an inverted clock signal DINOUT thereof.

The clock signal DINOUT is transferred through, for example, two-stage inverters INV12 and INV13 to become a control signal RE for column selecting (i.e., for controlling activation of the column decoder). The clock signal DINOUT is further transferred through other two-stage inverters INV14, INV15 and a delay circuit 63 to become other control signals REd and REdn, which are generated slightly behind the control signal RE.

The clock signal DINOUT is further supplied to a NOR gate G5, which is controlled by an output enable signal OEON. The output of the NOR gate G5 becomes the output data latch control signals REOLAT and REOLATn via two-stage inverters INV10 and INV11 for controlling the third switch CI5 and data latch 54 in the output buffer shown in FIG. 5. The output of the NOR gate G5 further becomes the output control signals REON and REONn, which are generated slightly behind the signals REOLAT and REOLATn, via a delay circuit 62 and two-stage inverters INV8 and INV9 for controlling the output circuit 55.

The output enable signal OEON is generated from, for example, a flip-flop 60 formed of NOR gates G3 and G4. This flip-flop 60 serves for activating or inactivating the output enable signal OEON based on an output enable command CMDOEON. That is, in case of the output enable signal OEON="L", which activates the NOR gate G5, the control signals REOLAT and REON may be generated as synchronous with the control signals RE and REd. On the other hand, when the output enable command CMDOEON is "H", the NOR gate G5 becomes inactive in response to the first read enable signal REn, thereby keeping the control signals REOLAT and REON "H" during the output operation hereinafter. In other words, it may be set such an output mode (say, "expanded data output" mode) that the output circuit 55 and data switch CI5 disposed just before it are kept active while the data output is performed.

Figure 7:
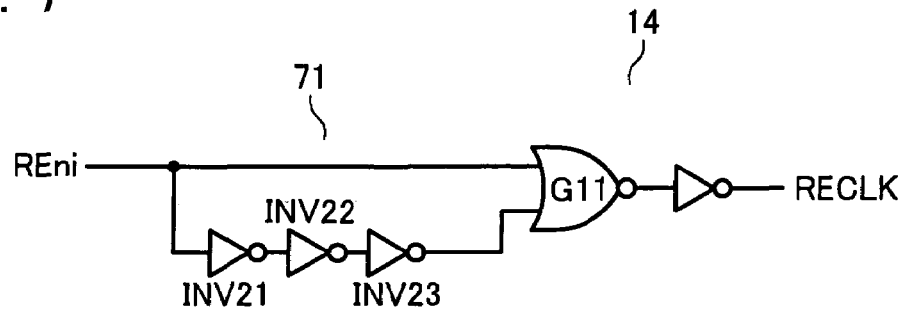
FIG. 7 shows an example of the internal clock generation circuit.

The internal clock generator 14 is formed of, for example, an edge detecting circuit 71 shown in FIG. 7. This edge detect circuit 71 has a NOR gate G11, to which the read enable signal REni and an inverted signal thereof delayed via an inverter chain with odd numbers of inverters (INV21–INV23) are input. Therefore, the edge detect circuit 71 detects a falling edge (i.e., logic level transition from "H" to "L") of the signal REni to generate the internal clock RECLK with a constant pulse width.

Figure 8:
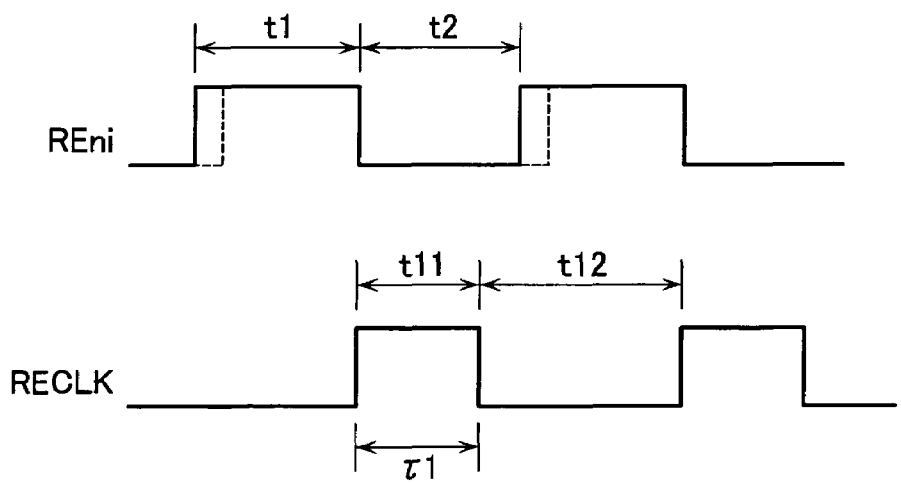
FIG. 8 shows waveforms of the internal clock generation circuit.

With the above-described edge detect circuit 71, as shown in FIG. 8, the internal clock signal RECLK may be generated with the same clock cycle, T(=t11+t12), as that, T(=t1+t2), of the signal REni. The time length, t11, of logic "H" of the internal clock RECLK will be defined by a delay time, τ, of the inverter chain formed of INV21–INV23. Further, even if the ratio, t1/t2, of the time length of logic "H" of the signal REni to the time length of logic "L" thereof is changed as shown by a dotted line due to some external cause, the ratio, t11/t12, of the time length, t11, of logic "H" of the internal clock signal RECLK to the time length, t12, of logic "L" thereof will not be changed.

Suppose that a "duty ratio" of a clock signal is defined as a ratio of "L" level time length to the clock cycle, and the edge detect circuit 71 is able to output an internal clock signal RECLK with a constant duty ratio, t12/(t11+t12), which is independent of the duty ratio, t2/(t1+t2), of the signal REni.

Figure 9:
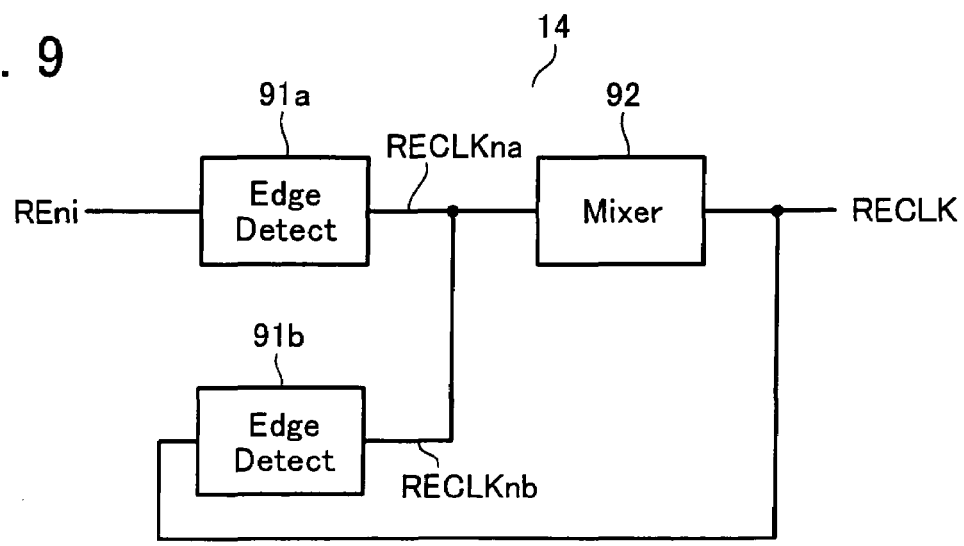
FIG. 9 shows another example of the internal clock generation circuit.

FIG. 9 shows another configuration of the internal clock generating circuit 14, which has an edge detect circuit 91a and a mixer 92. Preferably, the output of the mixer 92 is subjected to feed-back to another edge detect circuit 91b. The outputs of these two edge detect circuits 91a and 91b are merged in the mixer 92.

Figure 10:
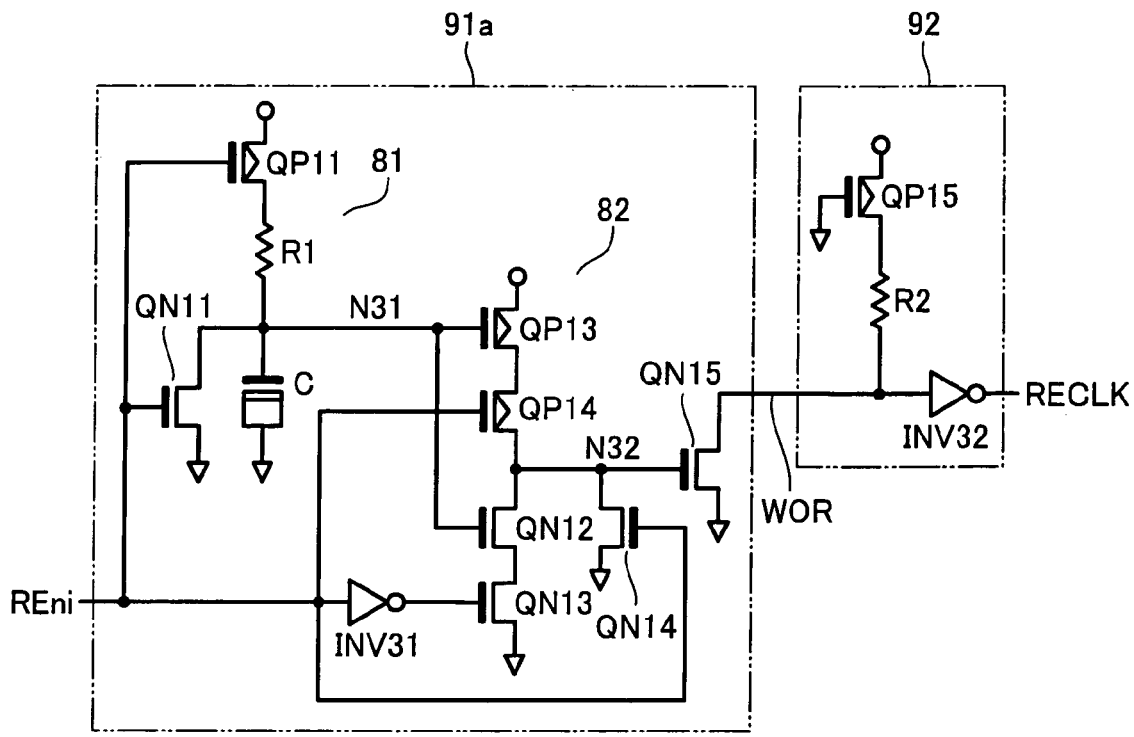
FIG. 10 shows a detailed configuration of the internal clock generation circuit.

A detailed configuration of the edge detecting circuit 91a and the mixer 92 is shown in FIG. 10. The edge detecting circuit 91b has the same configuration as the edge detecting circuit 91a. The edge detecting circuit 91a has a time constant circuit (i.e., integrator circuit) 81 and a clocked CMOS inverter 82 controlled by the circuit 81. The time constant circuit 81 includes a current source PMOS transistor QP11 driven by the signal REni, and resistor R1 and capacitor C connected in series to the transistor QP11.

The clocked CMOS inverter 82 includes PMOS transistor QP13 and NMOS transistor QN12, gates of which are coupled to an output node N31 of the time constant circuit 81, and PMOS transistor QP14 and NMOS transistor QN13, which are driven by the signal REni.

Output node N32 of the clocked inverter 82 is coupled to a gate of NMOS transistor QN15, drain of which is coupled to an input node WOR of the mixer 92. The mixer circuit 92 includes a pull-up circuit with a normally-on PMOS transistor QP15 and resistor R2 for charging-up the node WOR and an inverter INV32. Node WOR is one, to which an output of another edge detecting circuit is to be wired-OR connected.

With the above-described edge detect circuit 91a, the falling edge of the signal REni will be detected as follows. While the signal REni is "H", PMOS transistor QP11 is off; and reset-use NMOS transistors QN11 and QN14 are on so that the nodes N31 and N32 are held in an "L" level. When the signal REni changes in level from "H" to "L", the integral circuit 81 becomes on, thereby starting to charge the capacitor C. In the beginning of the charging operation, PMOS transistors QP13 and QP14 are on; NMOS transistor QN13 on; and NMOS transistor QN12 off. Therefore, the node N32 becomes "H".

After having elapsed a certain time determined by the RC time constant of the integrator circuit 81, PMOS transistor QP13 turns off, and NMOS transistor QN12 turns on in place. As a result, the node N32 is discharged through NMOS transistors QN12 and QN13 to be in an "L" level.

That is, at the falling edge of the signal REni, an "H" level signal is output to the node N32 with a constant pulse width defined by the integrator circuit 81. Therefore, an "L" level signal with a constant pulse with is output to the node WOR, to which drain of the NMOS transistor QN15 driven by the node N32 is coupled.

It should be noted that in case at least one, i.e., the output signal of the edge detect circuit 91a is input to the mixer 92, the internal clock signal RECLK may be output as a "H" level signal with a certain time length. However, in case the edge detect circuit 91a is used alone, the "H" level time length of the internal clock RECLK is limited by the "L" level time length of the signal REni. In consideration of this, another edge detect circuit 91b is prepared, to which the output of the mixer 92 is subjected to feed-back, and two outputs of these edge detect circuits 91a and 91b are subjected to wired OR. As a result, it becomes possible to generate an internal clock signal RECLK, the "H" level time length of which is not limited by the "L" level time length of the signal REni.

Figure 11:
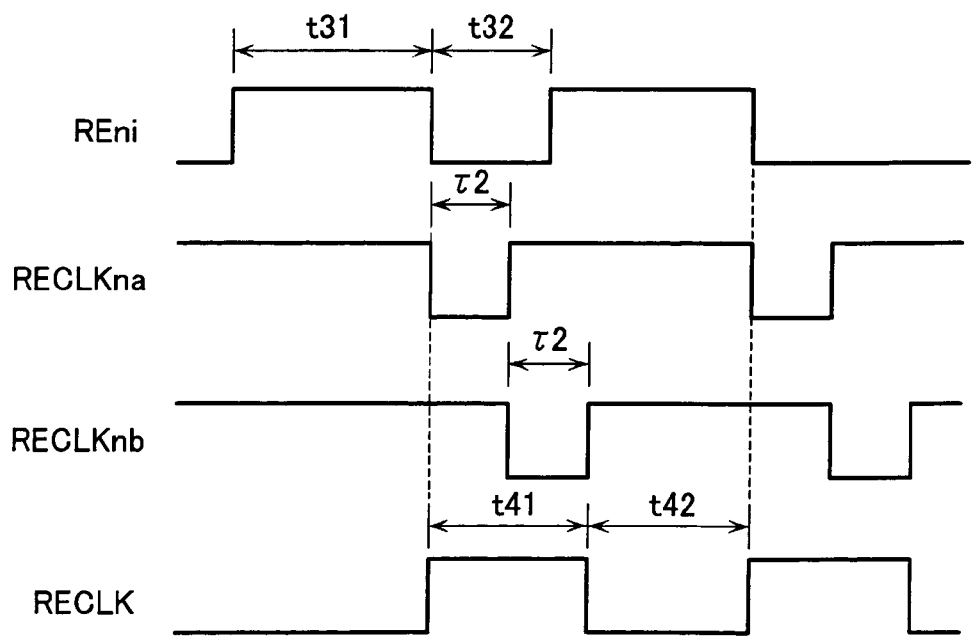
FIG. 11 shows waveforms of the internal clock generation circuit.

FIG. 11 shows operation waveforms of the internal clock generating circuit 14 shown in FIG. 9. Time, τ2, of "L" level outputs RECLKna and RECLKnb of two edge detect circuits 91a and 91b is less than the "L" level time, t32, of the signal REni. However, "H" level time, t41, of the internal clock signal RECLK, which is obtained by OR logic of the two outputs RECLKna and RECLKnb, becomes longer than the "L" level time, t32.

Clock cycle, t41+t42, of the internal clock signal RECLK is equal to that, t31+t32, of the signal REni. Further, the duty ratio, t42/(t41+t42), of the internal clock RECLK is constant without regard to that, t32/(t31+t32), of the signal REni.

According to this embodiment, as described above, data output of the sense amplifier circuit 3 and timing control of the output buffer 17 are controlled by the read enable network circuit 15a, to which the internal clock signal RECLK generated based on the read enable signal REn is supplied. A data read operation according to this embodiment will be explained bellow.

Figure 12:
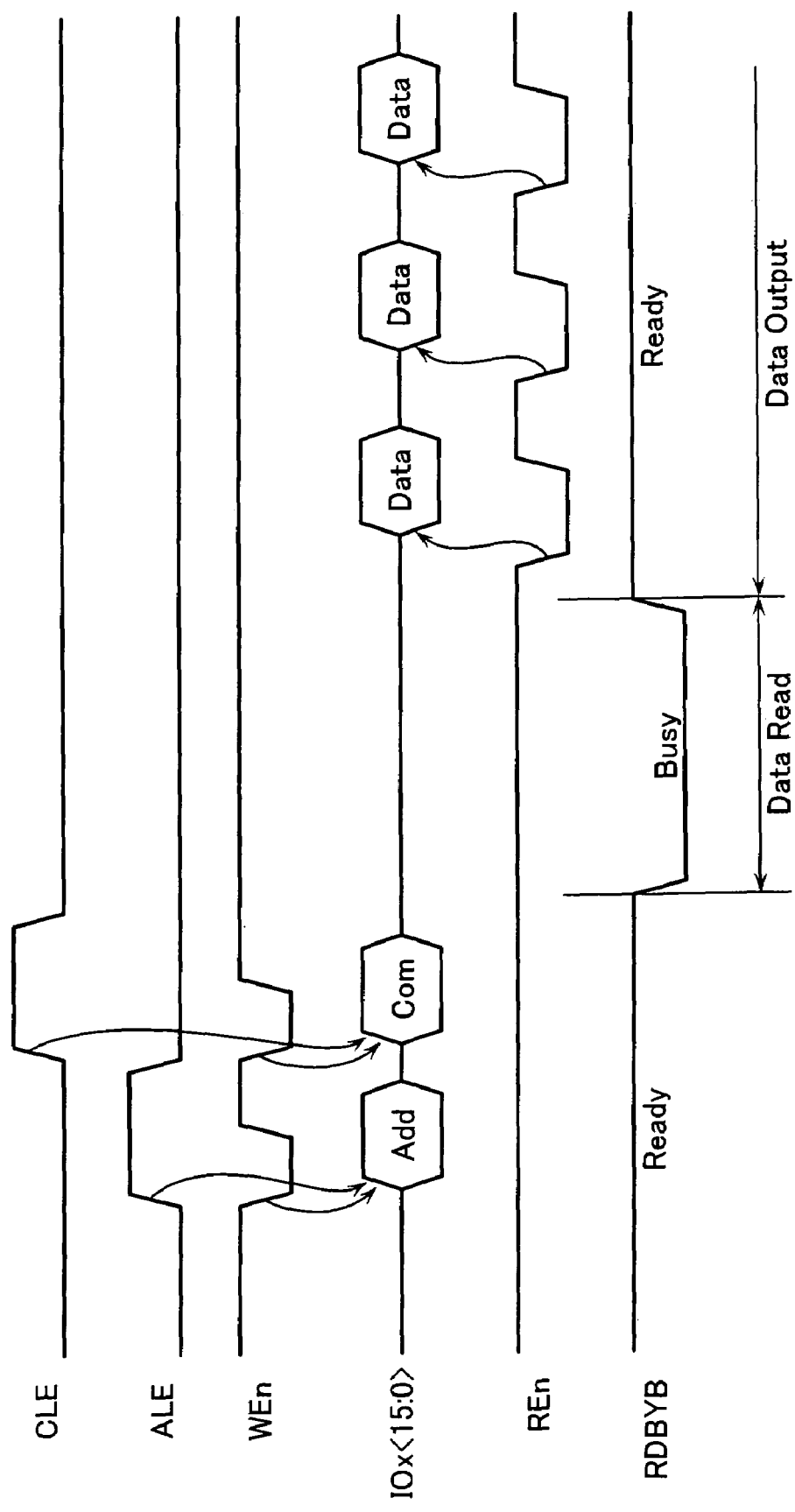
FIG. 12 is a timing chart showing a data read operation of the flash memory.

FIG. 12 shows a command chart in a data read mode. Input address data "Add", which is supplied to the input/output ports from a host device, together with address latch enable signal ALE and write enable signal WEn, and the address data "Add" is set in the address register 9. Following it, input command latch enable signal CLE and write enable signal WEn, and read-use command data "Com", which is supplied to the input/output ports from the host device, is input and decoded to be set in the state control circuit 7.

In response to these address and command data, the state control circuit 7 starts to execute data read of a selected page of the memory cell array. While data reading, ready/busy signal RDBYB="L"(Busy) is output outside of the chip. Read data held in the data cache of the sense amplifier circuit 3 are serially output two-byte by two-byte (or byte by byte) in accordance with sequential column select based on the read enable signal REn externally supplied.

Figure 13:
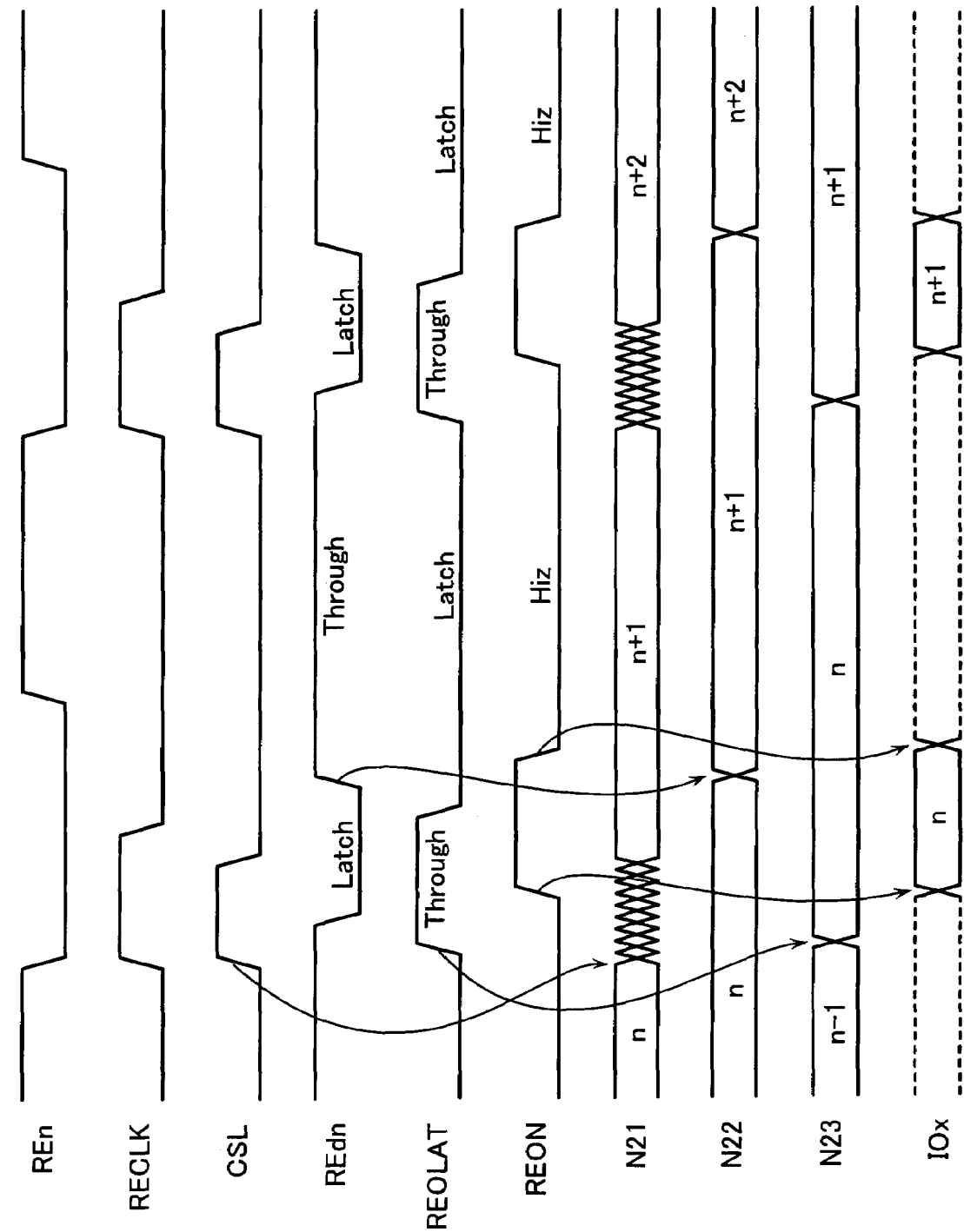
FIG. 13 is a timing chart showing a read data output operation of the flash memory.

FIG. 13 shows a detailed timing chart of the read data output operation in accordance with the read enable signal REn toggled. The internal clock signal RECLK is output as synchronous with the read enable signal REn, and column address is incremented in accordance with the internal clock signal RECLK, whereby column select signal CSL will be output.

When the column select signal CSL becomes "H", the switch CI1 shown in FIG. 5 turns on, whereby the read data amplified in the differential amplifier 51 is transferred to the node N21. While this data transferring, the bus switch 53 is kept off in accordance with the control signal REdn="L". Following the column select signal CSL, the control signals REOLAT and REON become "H" sequentially, whereby the switch CI5 turns on; the data latch 54 becomes to be a through state; and the output circuit 55 becomes active. Therefore, the read data held at the node N22 is output to the input/output port IOx.

When the control signal REdn becomes "H", the switch CI3 turns on so that the data held at the node N21 is transferred to the node N22. While this data transferring, the control signals REOLAT and REON are kept "L". Therefore, the switch CI5 is off; the data latch 54 is in a latch state; and the output circuit 55 is kept inactive (i.e., high output impedance state).

By repeat of the above-described operation hereinafter, one page read data will be serially output by two-byte (or by a byte).

According to this embodiment, the read data output operation is controlled by the internal clock signal RECLK, which is generated based on the read enable signal REn externally supplied. Since the internal clock signal RECLK is generated by detecting the edge of the read enable signal REn, it has the same clock cycle as the read enable signal REn. Further, even if the duty ratio of the read enable signal REn is varied due to some external cause, the internal clock signal is not influenced by it, and retained in a state with a constant duty ratio. As a result, erroneous operations such as erroneous read and data output with erroneous address may be protected, and it is possible to output the read data with a high rate. Further, since it is possible to secure static control timings for the read data output path (i.e., output data transfer circuits) without regard to the quality of the read enable signal, it becomes easy to design the output data transfer circuits.

EMBODIMENT 2

Figure 14:
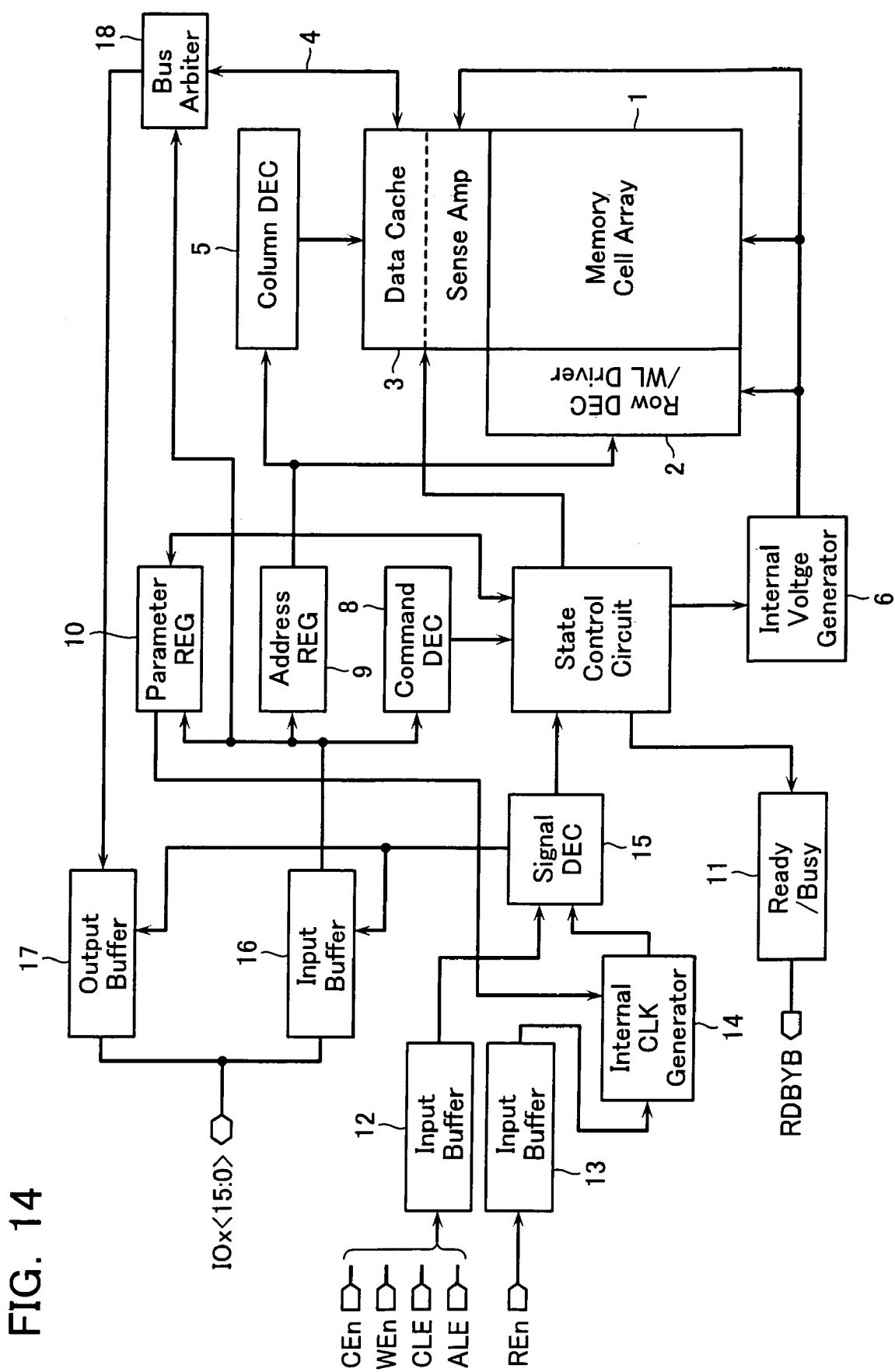
FIG. 14 shows a functional block of a flash memory in accordance with another embodiment.

FIG. 14 shows a functional block diagram of a NAND-type flash memory in accordance with Embodiment 2. The portions corresponding to those in FIG. 1 are denoted by the same reference signs as in FIG. 1, and detailed explanation thereof will be omitted.

In this Embodiment 2, the parameter register 10, which is usually utilized only in a test mode, is configured to be able to store a control parameter, which is used for adapting the chip to operation circumstances (for example, read configuration), and output it for setting and/or changing operation circumstances corresponding to a host device in response to a specified circumstance setting command.

Figure 15:
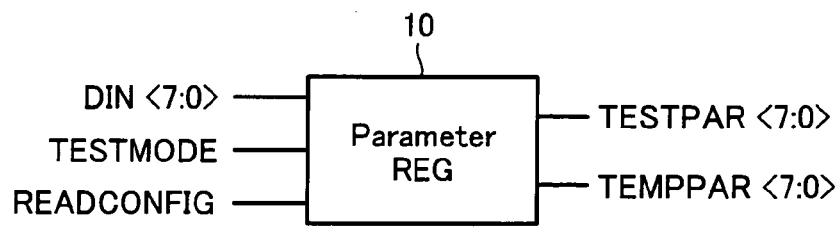
FIG. 15 shows input/output relationships of a parameter register of the flash memory.

FIG. 15 shows input/output relationships of the parameter register 10 in accordance with this embodiment. In case of setting data DIN<7:0> in the parameter register 10 together with a test mode signal TESTMODE, the parameter register 10 outputs test-use parameter TESTPAR<7:0>. In addition, in this embodiment, input data DIN<7:0> in the parameter register 10 together with a read configuration setting signal READCONFIG, and it is possible to output temporary control parameter TEMPPAR<7:0> for setting a read configuration.

The data serving as the control parameter is supplied from the input/output ports IOx<15:0> and set in the parameter register 10 under the control of the state control circuit 7 as well as the test-use parameter. A data input enable signal DATAIN (shown in FIG. 16), circumstance setting signal READCONFIG and test signal TESTMODE are output from the state control circuit 7 in response to the respective commands externally supplied.

Figure 16:
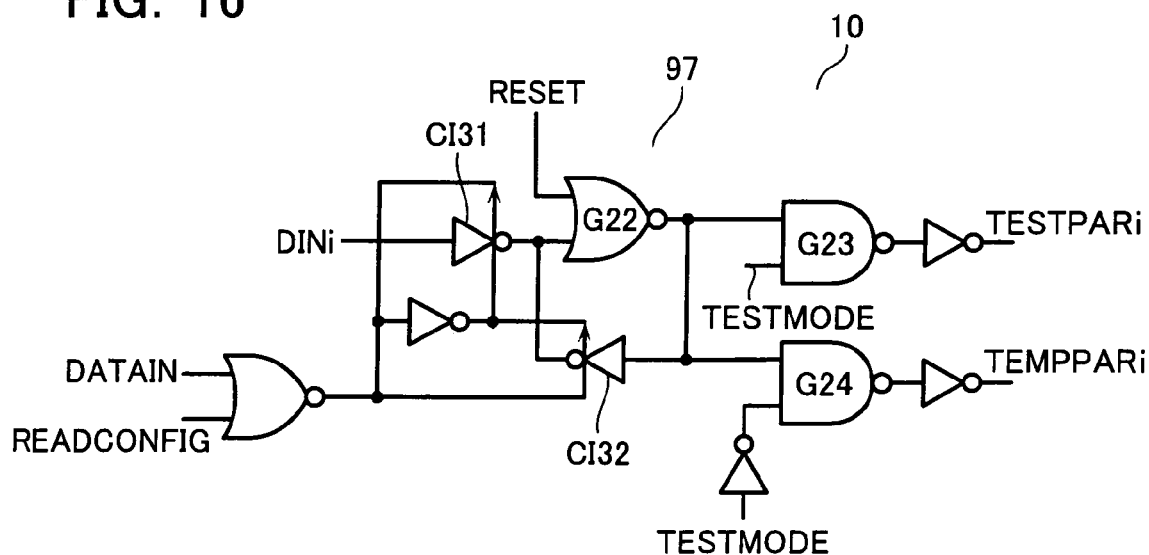
FIG. 16 shows a configuration per bit of the parameter register.

FIG. 16 shows a detailed configuration of the parameter register 10 for one bit portion. The parameter data DINi is loaded in a data latch 97 via a clocked CMOS inverter CI31 controlled by either one of the data input enable signal DATAIN and circumstance setting signal READCONFIG. The data latch 97 is formed of a NOR gate G22 and a clocked CMOS inverter CI32, data of which may be reset by a reset signal RESET.

A NAND gate G23 activated by test mode signal TESTMODE="H" and another NAND gate G24 activated by test mode signal TESTMODE="L" constitute an output gate circuit of the data latch 97. In the test mode, the test parameter TESTPARi is output in response to TESTMODE="H"; and in the read circumstance set/change mode, the control parameter TEMPPARi is output for setting operation circumstances in response to TESTMODE="L".

Figure 17:
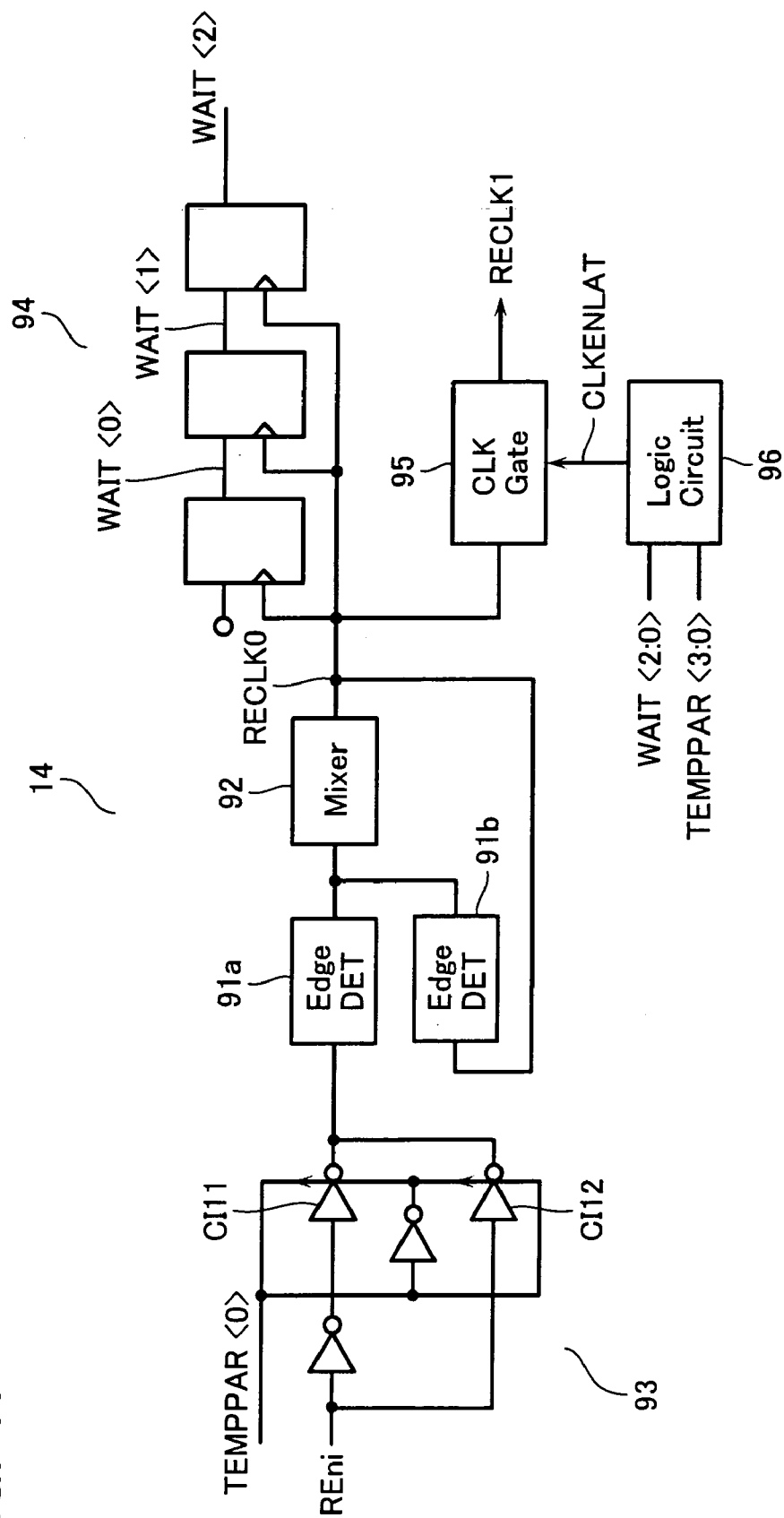
FIG. 17 shows an internal clock generation circuit controlled by control parameters output from the parameter register.

FIG. 17 shows an example of the internal clock generating circuit 14, to which the above-described control parameter TEMPPAR<7:0> is transferred to set a read configuration therein. The main portion of the internal clock generation circuit 14 includes edge detect circuits 91a and 91b, and mixer 92 as well as that shown in FIG. 9 of the above-described embodiment.

A signal polarity switching circuit 93 is disposed at the input stage of the internal clock generation circuit 14. This polarity switch circuit 93 has clocked CMOS inverters CI11 and CI12, which becomes on or off as complementary to each other under the control of a control parameter, e.g., TEMPPAR<0>. In case of TEMPPAR<0>="L", CMOS inverter CI11 turns on so that the read enable signal REni is transferred to the edge detect circuit 91a without logic inverting. By contrast, in case of TEMPPAR<0>="H", CMOS inverter CI12 turns on to transfer the read enable signal REni to the edge detect circuit 91a with logic level inverting.

That is, set the control parameter TEMPPAR<0>="1" (="H") in the parameter register 10, and it becomes possible to transfer the read enable signal REni to internal circuits as an level inverted signal as different from the ordinary state. What this means is that the memory chip may be adapted to a case where the external host device (memory controller) is defined to rather let logic "H" of the read enable signal be in an "output enable" state than let logic "L" be in an output enable state. That is, it becomes possible to dynamically change the read circumstance or configuration of the flash memory inside the chip.

Further, it is sometimes required of the external memory controller to set a certain setup time (waiting time) at the beginning of the read enable signal for output-allowing. For example, the memory controller often has such a specification that several cycles in the beginning of the read enable signal are defined as dummy cycles while data taking-in is inhibited.

To make a flash memory adaptable to such the memory controller, it is disposed, as shown in FIG. 17, a clock gate circuit 95 for controlling transmission of the internal clock RECLK0 and a clock counter 94 for controlling the clock gate circuit 95 at the output stage of the internal clock generation circuit 14. A logic circuit 96 is prepared for controlling the clock gate circuit 95, which outputs a clock enable signal CLKENLAT based on a logic of the output WAIT<2:0> of counter 94 and the control parameter TEMPPAR<3:1>.

Figure 18:
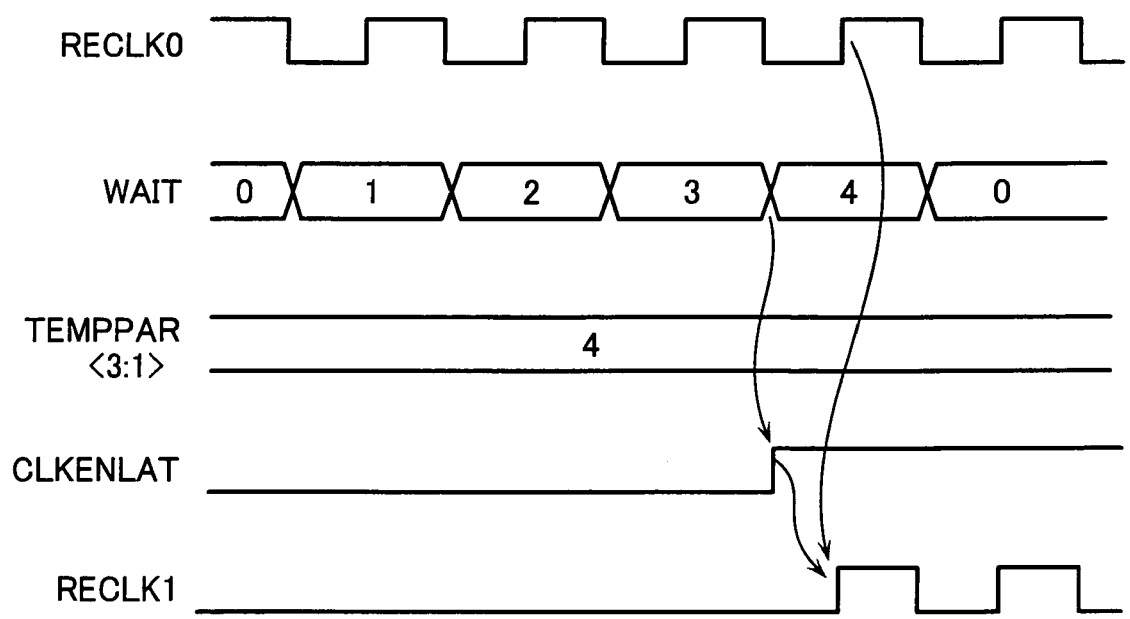
FIG. 18 is a timing chart showing an internal clock signal generation of the internal clock generation circuit.

FIG. 18 shows an example of the internal clock generating operation where the control parameter is set as TEMPPAR<3:1>=4. The clock gate circuit 95 keeps off until the internal cock signal RECLK0 is counted up to 4. When the internal clock signal RECLK0 is counted up to 4, the clock gate circuit 95 becomes active to output internal clock signal RECLK1 hereinafter.

As described above, set the control parameter TEMPPRA<3:1> in the parameter register 10, and it becomes possible to set a certain waiting period in the beginning of the read enable signal REn. Since this operation circumstance also is changeable, the flash memory may be improved in convenience.

As described above, according to this embodiment, there is provided a flash memory with a high convenience, which is adaptable to various external memory controllers.

Although two operation circumstance parameters, i.e., logic level changing parameter and output waiting time setting parameter, have been explained in this embodiment, the present invention is not limited to this. For example, it is also effective to use either one of the above described parameters. Alternatively, it is possible to set other control parameters as changeable.

EMBODIMENT 3

Figure 19:
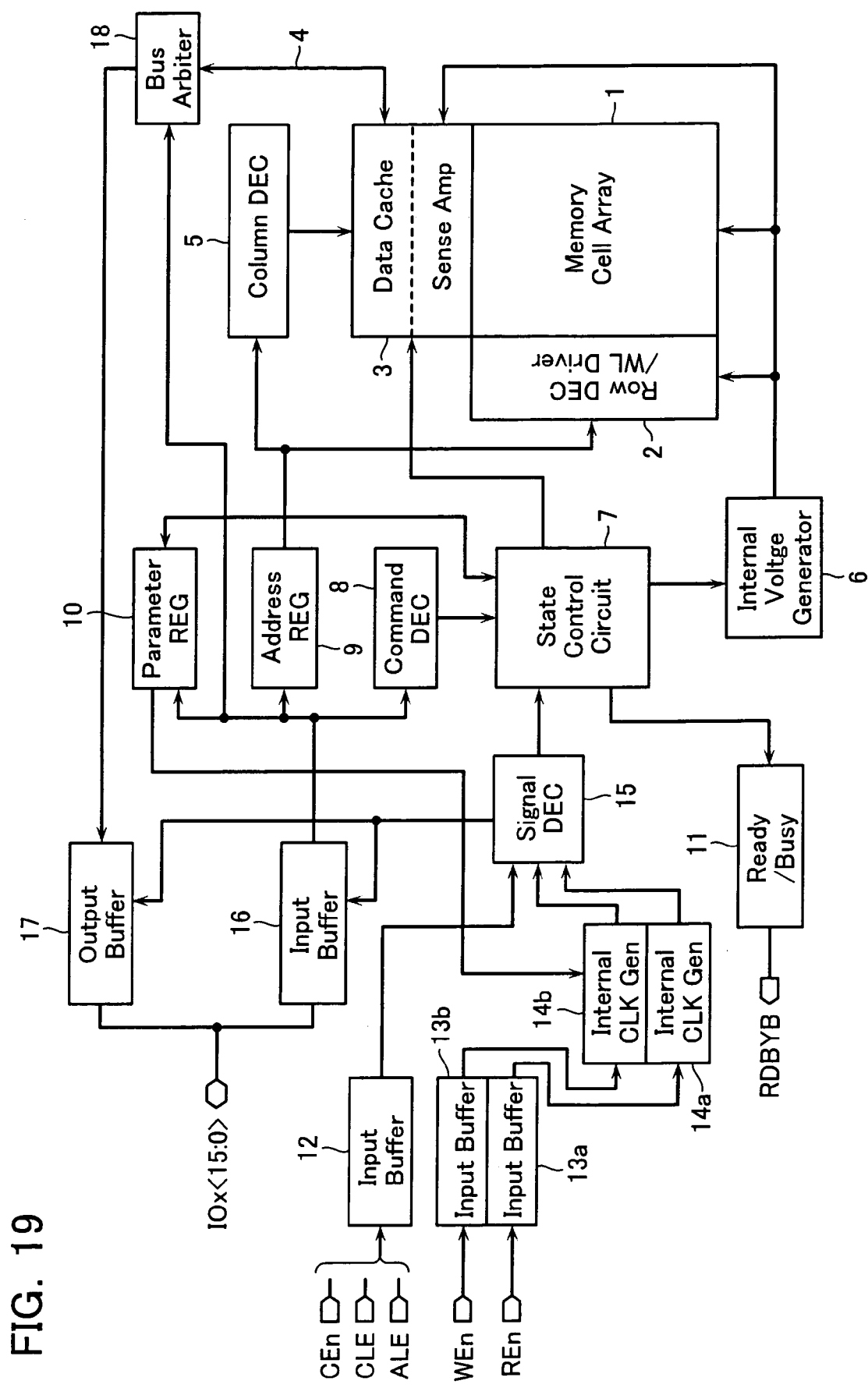
FIG. 19 shows a functional block of a flash memory in accordance with still another embodiment.

FIG. 19 shows a NAND-type flash memory in accordance with another embodiment where not only a data read operation but also a data write operation are taken in for improving operation speed thereof. A detailed explanation will be omitted because the main portions corresponding to those in FIG. 14 are denoted by the same reference signs as in FIG. 14.

An internal clock generation circuit 14a is disposed at the output node of the input buffer 13a disposed in association with the read enable signal REn. This is the same as above-described Embodiments 1 and 2. In this Embodiment 3, another internal clock generation circuit 14b is disposed at the output node of another input buffer 13b disposed in association with the write enable signal WEn. These internal clock generation circuits 14a and 14b may be formed as similar to that described in Embodiment 1.

In a data write mode, write command and write address are input as synchronous with the write enable signal WEn, following this write data are input as synchronous with the write enable signal WEn. One page write data are loaded in the sense amplifier circuit 3 via the input buffer 16 two-byte by two-byte (or byte by byte). Hereinafter, the write data loaded in the sense amplifier circuit 3 are written into a selected page of the memory cell array 1 simultaneously.

In this embodiment, the data transferring at the write data load time is controlled by the internal clock signal generated from the internal clock signal generation circuit 14b based on the write enable signal WEn. Therefore, even if the duty ratio of the write enable signal WEn is varied due to some external cause, it becomes possible to perform the write data load with a high rate and a high accuracy as free from influence of the duty ratio variation.

Note here that since the read enable signal REn is kept "H" in the data write mode, it is not necessary to prepare the internal clock generation circuits 14a and 14b, separately. Therefore, it is effective that the write enable signal system and read enable signal system share one internal clock generation circuit, which is able to be changed between the two systems.

EMBODIMENT 4

As an embodiment, an electric card using the non-volatile semiconductor memory devices according to the above-described embodiments 1–3 of the present invention and an electric device using the card will be described below.

Figure 20:
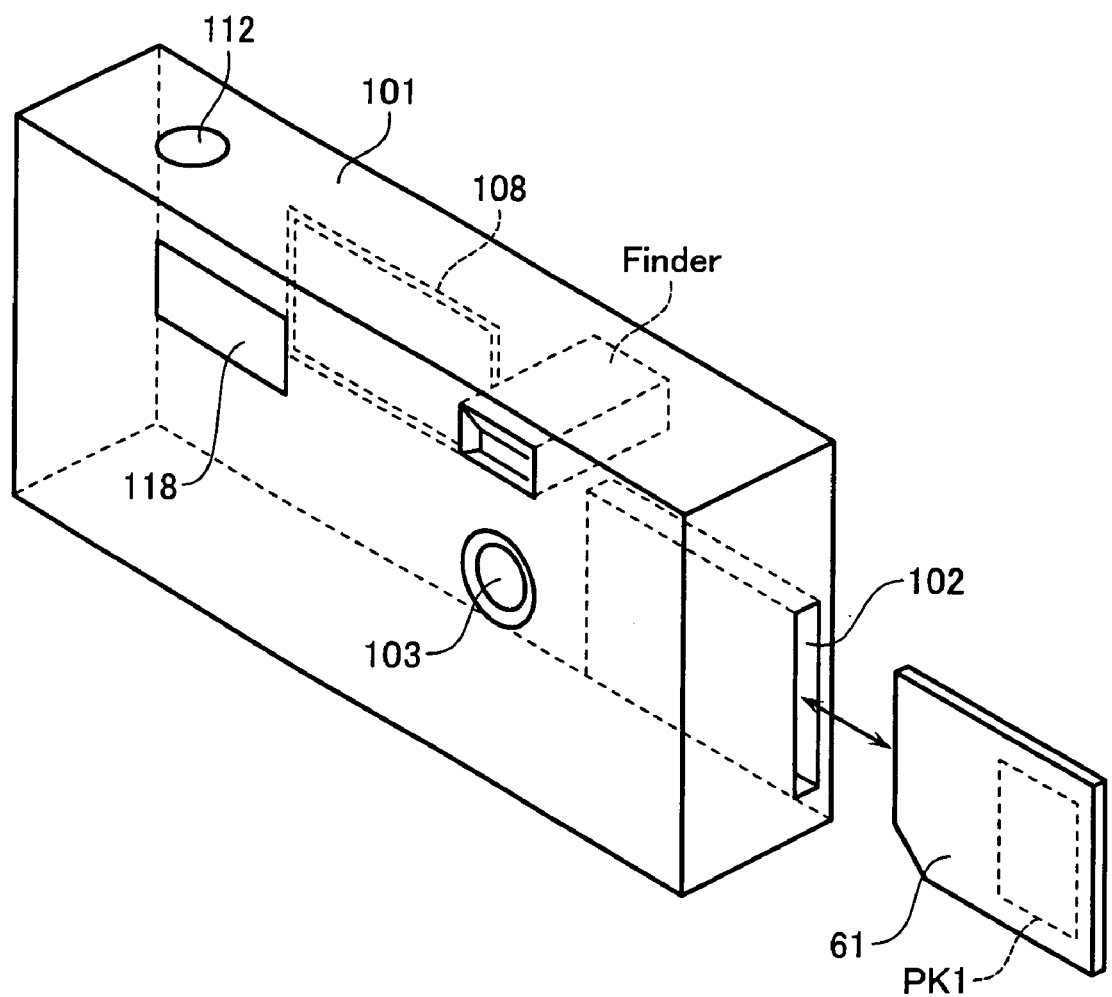
FIG. 20 shows an embodiment applied to a digital still camera.

FIG. 20 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1 in which the non-volatile semiconductor memory device or the memory system according to the above-described embodiments is integrated or encapsulated.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 21:
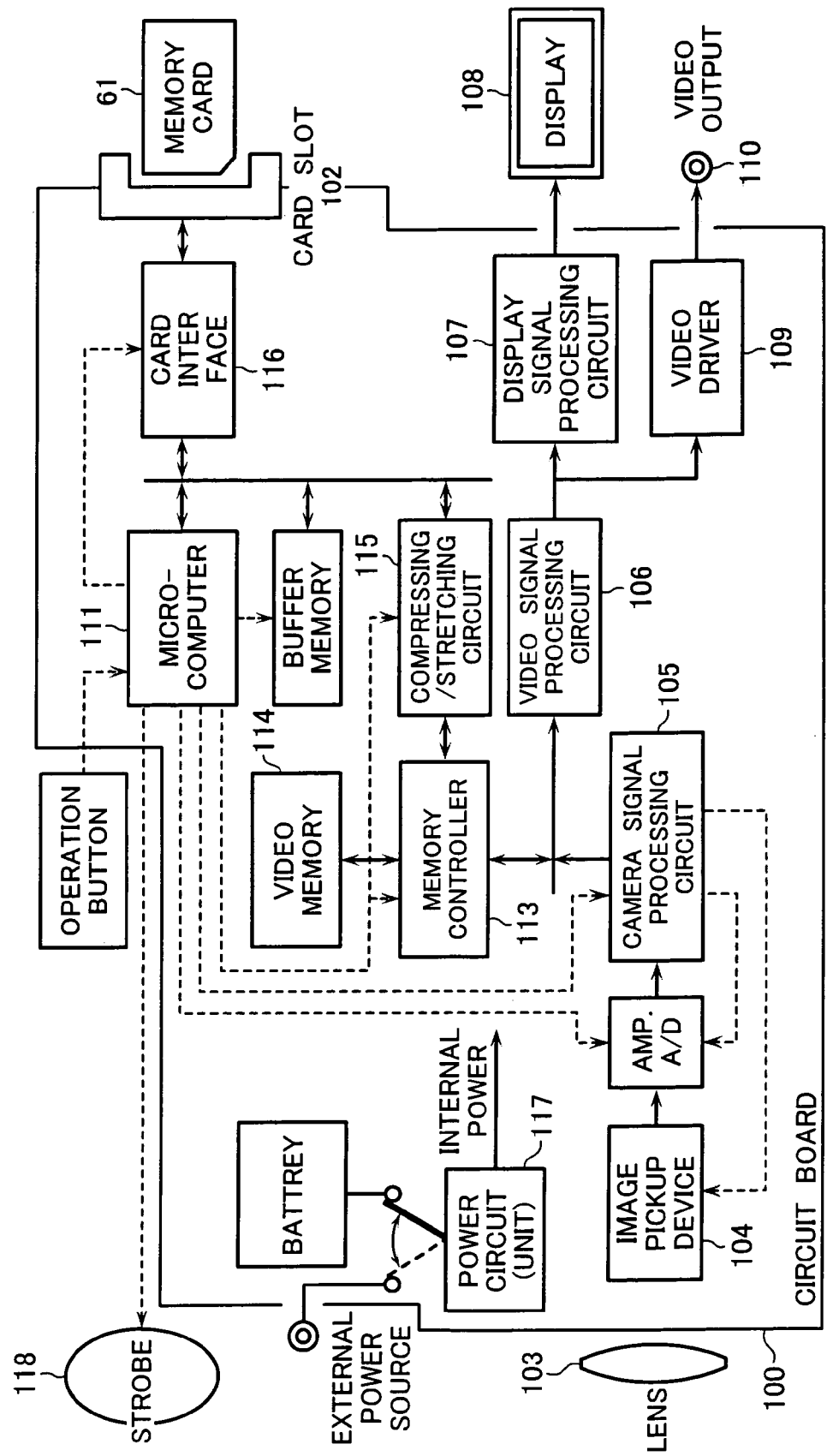
FIG. 21 shows the internal configuration of the digital still camera.
Figure 22A:
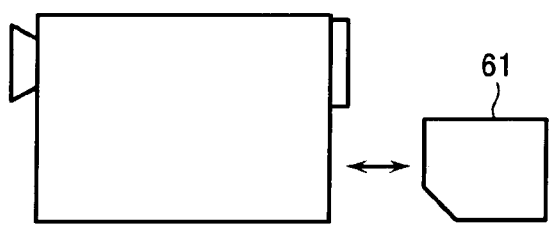
FIGS. 22A to 22J show other electric devices to which the embodiment is applied.
Figure 22F:
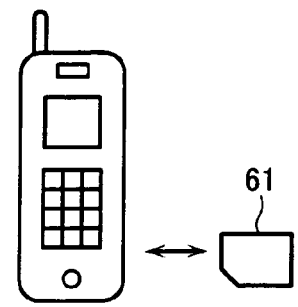
Figure 22B:
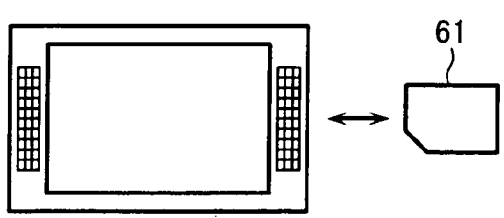
Figure 22G:
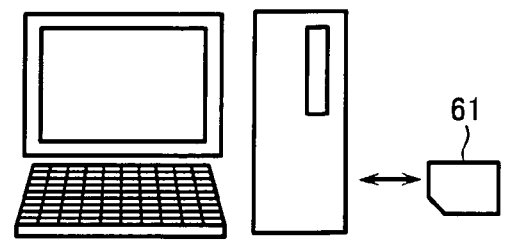
Figure 22C:
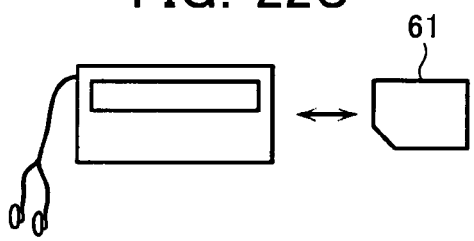
Figure 22H:
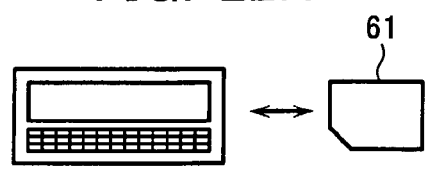
Figure 22D:
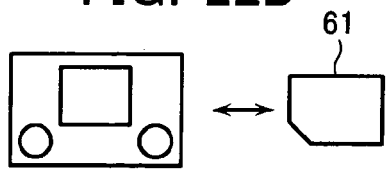
Figure 22I:
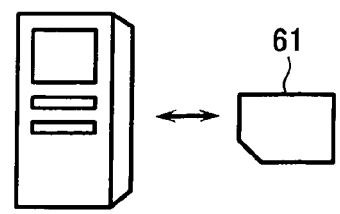
Figure 22E:
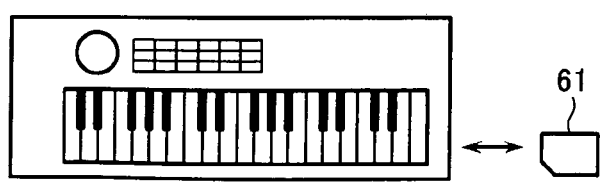
Figure 22J:
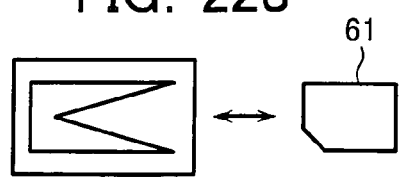

FIG. 21 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 22A to 22J, as well as in portable electric devices. That is, the electric card can also be used in a video camera shown in FIG. 22A, a television set shown in FIG. 22B, an audio apparatus shown in FIG. 22C, a game apparatus shown in FIG. 22D, an electric musical instrument shown in FIG. 22E, a cell phone shown in FIG. 22F, a personal computer shown in FIG. 22G, a personal digital assistant (PDA) shown in FIG. 22H, a voice recorder shown in FIG. 22I, and a PC card shown in FIG. 22J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
   a memory cell array, in which electrically rewritable and non-volatile memory cells are arranged;
   a sense amplifier circuit configured to be coupled to said memory cell array;
   a data transfer circuit disposed between said sense amplifier circuit and data input/output ports;

a control signal generation circuit configured to generate a plurality of control signals based on a reference clock signal externally supplied, the control signals serving for controlling data input and output of said sense amplifier circuit and data transferring timing in said data transfer circuit; and an internal clock signal generation circuit configured to generate an internal clock signal based on the reference clock signal for serving as the basis of the control signals, the internal clock signal having the same clock cycle as the reference clock signal and a constant duty ratio without regard to the duty ratio of the reference clock signal.

2. The semiconductor memory device according to claim 1, wherein said internal clock signal generation circuit comprises an edge detect circuit configured to detect a level transition from a first logic level to a second logic level of the reference clock signal, thereby generating the internal clock signal with a constant pulse width.

3. The semiconductor memory device according to claim 1, wherein said internal clock signal generation circuit comprises:

a first edge detect circuit configured to detect a level transition from a first logic level to a second logic level of the reference clock signal, thereby generating a first clock signal with a constant pulse width;

a second edge detect circuit configured to detect a level transition from the first logic level to the second logic level of the first clock signal, thereby generating a second clock signal with a constant pulse width; and a mixer configured to merge the first and second clock signals generated from said first and second edge detect circuits to generate the internal clock signal.

4. The semiconductor memory device according to claim 1, wherein said sense amplifier circuit comprises:

a page buffer so disposed to be coupled to said memory cell array as to read one page data of said memory cell array and hold one page write data;

a data cache configured to temporarily hold read data of said page buffer and write data to be loaded in said page buffer, one page data being transferred in parallel between said page buffer and data cache; and a column select gate circuit disposed between said data cache and data transfer circuit.

5. The semiconductor memory device according to claim 1, wherein said data transfer circuit is a data buffer comprises:

a plurality of transfer switches controlled by said plurality of control signals, respectively, to serve for outputting the read data of said sense amplifier circuit to said input/output ports; and data latches disposed at output portions of said transfer switches respectively, and controlled, as to be complementary to said transfer switches respectively.

6. The semiconductor memory device according to claim 1, wherein said memory cell array comprises NAND cell units each having a plurality of memory cells connected in series, gates of which are coupled to different word lines, and select gate transistors for coupling both ends of the serially connected memory cells to a bit line and a common source line, respectively.

7. An electric card equipped with a semiconductor memory device, said semiconductor memory device comprising:

a memory cell array, in which electrically rewritable and non-volatile memory cells are arranged;

a sense amplifier circuit configured to be coupled to said memory cell array;

a data transfer circuit disposed between said sense amplifier circuit and data input/output ports;

a control signal generation circuit configured to generate a plurality of control signals based on a reference clock signal externally supplied, the control signals serving for controlling data input and output of said sense amplifier circuit and data transferring timing in said data transfer circuit; and an internal clock signal generation circuit configured to generate an internal clock signal based on the reference clock signal for serving as the basis of the control signals, the internal clock signal having the same clock cycle as the reference clock signal and a constant duty ratio without regard to the duty ratio of the reference clock signal.

8. An electric device comprises:

a card interface;

a card slot connected to said card interface; and an electric card defined in claim 7 and disposed to be electrically connectable to said card slot.

9. A semiconductor memory device comprising:

a memory cell array, in which electrically rewritable and non-volatile memory cells are arranged;

a sense amplifier circuit configured to be coupled to said memory cell array;

a data transfer circuit disposed between said sense amplifier circuit and data input/output ports;

a control signal generation circuit configured to generate a plurality of control signals based on a reference clock signal externally supplied, the control signals serving for controlling data input and output of said sense amplifier circuit and data transferring timing in said data transfer circuit;

an internal clock signal generation circuit configured to generate an internal clock signal based on the reference clock signal for serving as the basis of the control signals, the internal clock signal having the same clock cycle as the reference clock signal and a constant duty ratio without regard to the duty ratio of the reference clock signal; and a parameter register configured to be able to store a control parameter and output it for setting operation circumstances corresponding to a host device.

10. The semiconductor memory device according to claim 9, wherein said parameter register is configured to be able to store a control parameter and output it, which is transferred to said internal clock signal generation circuit for setting or changing clock signal generation mode thereof.

11. The semiconductor memory device according to claim 9, wherein said parameter register is configured to be able to store a test-use parameter and output it in a test mode.

12. The semiconductor memory device according to claim 9, wherein said internal clock signal generation circuit comprises an edge detect circuit configured to detect a level transition from a first logic level to a second logic level of the reference clock signal, thereby generating the internal clock signal with a constant pulse width.

13. The semiconductor memory device according to claim 9, wherein said internal clock signal generation circuit comprises:

a first edge detect circuit configured to detect a level transition from a first logic level to a second logic level of the reference clock signal, thereby generating a first clock signal with a constant pulse width;

a second edge detect circuit configured to detect a level transition from the first logic level to the second logic level of the first clock signal, thereby generating a second clock signal with a constant pulse width; and a mixer configured to merge the first and second clock signals generated from said first and second edge detect circuits to generate the internal clock signal.

14. The semiconductor memory device according to claim 9, wherein said sense amplifier circuit comprises:

a page buffer so disposed to be coupled to said memory cell array as to read one page data of said memory cell array and hold one page write data;

a data cache configured to temporarily hold read data of said page buffer and write data to be loaded in said page buffer, one page data being transferred in parallel between said page buffer and data cache; and a column select gate circuit disposed between said data cache and data transfer circuit.

15. The semiconductor memory device according to claim 9, wherein said data transfer circuit is a data buffer comprising:

a plurality of transfer switches controlled by said plurality of control signals, respectively, to serve for outputting the read data of said sense amplifier circuit to said input/output ports; and data latches disposed at output portions of said transfer switches respectively, and controlled as to be complementary to said transfer switches respectively.

16. The semiconductor memory device according to claim 9, wherein said memory cell array comprises NAND cell units each having a plurality of memory cells connected in series, gates of which are coupled to different word lines, and select gate transistors for coupling both ends of the serially connected memory cells to a bit line and a common source line, respectively.

17. An electric card equipped with a semiconductor memory device, said semiconductor memory device comprising:

a memory cell array, in which electrically rewritable and non-volatile memory cells are arranged;

a sense amplifier circuit configured to be coupled to said memory cell array;

a data transfer circuit disposed between said sense amplifier circuit and data input/output ports;

a control signal generation circuit configured to generate a plurality of control signals based on a reference clock signal externally supplied, the control signals serving for controlling data input and output of said sense amplifier circuit and data transferring timing in said data transfer circuit;

an internal clock signal generation circuit configured to generate an internal clock signal based on the reference clock signal for serving as the basis of the control signals, the internal clock signal having the same clock cycle as the reference clock signal and a constant duty ratio without regard to the duty ratio of the reference clock signal; and a parameter register configured to be able to store a control parameter and output it for setting operation circumstances corresponding to a host device.

18. An electric device comprises:

a card interface;

a card slot connected to said card interface; and an electric card defined in claim 17 and disposed to be electrically connectable to said card slot.

* * * * *